(12) United States Patent
Su

(10) Patent No.: US 10,881,039 B1
(45) Date of Patent: Dec. 29, 2020

(54) ELECTROMAGNETIC INTERFERENCE SHIELDING FILM, CIRCUIT BOARD, AND PREPARATION METHOD FOR ELECTROMAGNETIC INTERFERENCE SHIELDING FILM

(71) Applicant: GUANGZHOU FANG BANG ELECTRONIC CO., LTD., Guangdong (CN)

(72) Inventor: Zhi Su, Guangdong (CN)

(73) Assignee: GUANGZHOU FANG BANG ELECTRONIC CO., LTD., Guangdong (CN)

( * ) Notice: Subject to any disclaimer, the term of this patent is extended or adjusted under 35 U.S.C. 154(b) by 0 days.

(21) Appl. No.: 16/623,939

(22) PCT Filed: Mar. 22, 2018

(86) PCT No.: PCT/CN2018/080019
§ 371 (c)(1),
(2) Date: Dec. 18, 2019

(87) PCT Pub. No.: WO2019/174065
PCT Pub. Date: Sep. 19, 2019

(30) Foreign Application Priority Data

Mar. 14, 2018 (CN) .......................... 2018 1 0210836

(51) Int. Cl.
*H05K 9/00* (2006.01)
*H05K 1/02* (2006.01)
*B32B 3/08* (2006.01)

(52) U.S. Cl.
CPC ........... *H05K 9/0088* (2013.01); *B32B 3/085* (2013.01); *H05K 1/0216* (2013.01);
(Continued)

(58) Field of Classification Search
CPC .......................... H05K 9/0088; H05K 9/0083
See application file for complete search history.

(56) References Cited

U.S. PATENT DOCUMENTS 9,609,793 B2 * 3/2017 Kawaguchi .......... H05K 9/0088
9,685,413 B1 * 6/2017 Prakash ................ H01L 21/485
(Continued)

FOREIGN PATENT DOCUMENTS

CN 203859982 U 10/2014
CN 204385118 U 6/2015
(Continued)

*Primary Examiner* — Hung V Ngo
(74) *Attorney, Agent, or Firm* — Shumaker, Loop & Kendrick, LLP; James D. Miller

(57) ABSTRACT

Disclosed are an Electromagnetic Interference shielding film, a circuit board and a preparation method of the electromagnetic Interference shielding film. The electromagnetic Interference shielding film includes: a first shielding layer, a second shielding layer, an adhesive film and multiple convex particles, wherein the first shielding layer includes a first surface and a second surface opposite to each other; the second surface is a flat surface; the multiple convex particles are adhered on the second surface of the first shielding layer; the second shielding layer is disposed on the second surface of the first shielding layer and covers the multiple convex particles, thereby forming a protrusion portion at a position corresponding to the convex particles on an outer surface of the second shielding layer and forming a gentle portion at other positions; and the adhesive film is disposed on the outer surface of the second shielding layer.

20 Claims, 2 Drawing Sheets

(52) U.S. Cl.
CPC ......... *H05K 9/0083* (2013.01); *H05K 9/0084* (2013.01); *B32B 2307/212* (2013.01); *B32B 2457/08* (2013.01)

(56) References Cited

U.S. PATENT DOCUMENTS

| | | | |
|---|---|---|---|
| 9,881,876 B2* | 1/2018 | Homma | H01L 23/552 |
| 10,652,996 B2* | 5/2020 | Chiu | H05K 1/0216 |
| 2012/0127578 A1* | 5/2012 | Bright | G02B 1/116 |
| | | | 359/585 |
| 2013/0206315 A1* | 8/2013 | Chung | H05K 9/0088 |
| | | | 156/60 |
| 2015/0030878 A1* | 1/2015 | Zhi | H05K 9/0088 |
| | | | 428/650 |
| 2015/0201535 A1* | 7/2015 | Su | H05K 9/0084 |
| | | | 174/388 |
| 2016/0057898 A1* | 2/2016 | Lai | H05K 9/0026 |
| | | | 174/377 |
| 2016/0286698 A1* | 9/2016 | Chang | B32B 27/26 |
| 2017/0358540 A1* | 12/2017 | Min | H01L 23/295 |
| 2019/0261503 A1* | 8/2019 | Haruna | H05K 1/0215 |
| 2020/0084923 A1* | 3/2020 | Cui | H05K 9/0084 |

FOREIGN PATENT DOCUMENTS

| | | |
|---|---|---|
| CN | 206481556 U | 9/2017 |
| CN | 206650912 A | 11/2017 |
| JP | 2003298285 A | 10/2003 |
| JP | 2014049498 A | 3/2014 |

\* cited by examiner

ELECTROMAGNETIC INTERFERENCE SHIELDING FILM, CIRCUIT BOARD, AND PREPARATION METHOD FOR ELECTROMAGNETIC INTERFERENCE SHIELDING FILM

CROSS-REFERENCE TO RELATED PATENT APPLICATIONS

The present disclosure is a United States national phase patent application under 35 U.S.C. § 371 of International Patent Application No. PCT/CN2018/080019 filed Mar. 22, 2018, entitled "Electromagnetic Interference shielding film, circuit board, and preparation method for electromagnetic Interference shielding film", which claims the benefit of Chinese Patent Application No. 201810210836.2 filed Mar. 14, 2018, the contents of both of which are hereby incorporated herein by reference in their entirety.

TECHNICAL FIELD

The disclosure relates to the field of electronics, and more particularly to an Electromagnetic Interference shielding film, a circuit board, and a preparation method for an electromagnetic Interference shielding film.

BACKGROUND

With the rapid development of an electronic industry, electronic products further develop to small size, light weight and high assembly density, and greatly promote the development of flexible circuit boards, thereby achieving integration of element device and wire connection. The flexible circuit boards may be widely applied to industries such as mobile phones, liquid crystal displays, communications and aerospace.

Under the promotion of an international market, a functional flexible circuit board plays a dominant role in a flexible circuit board market. An important indicator for evaluating the functional flexible circuit board is electromagnetic Interference (EMI) shielding. With the integration of functions of communication equipment such as a mobile phone, internal components thereof are subjected to sharp high frequency and high speed. For example, the mobile phone has a necessary function namely a photography function in addition to an original audio propagation function, a Wireless Local Area Networks (WLAN) function, a Global Positioning System (GPS) function and a networking function have been popularized, and it will inevitably tend to sharp high-frequency and high-speed components in conjunction with the future integration of sensing components. The problems of EMI inside and outside a component, signal transmission attenuation, insertion loss and jitter caused by high-frequency and high-speed drive are gradually severe.

At present, a shielding film commonly used for an existing circuit board includes a shielding layer and a conductive adhesive layer. The conductive adhesive layer is connected to a ground layer of the circuit board by means of the shielding layer, thus guiding an interference charge to the ground layer of the circuit board and implementing the shielding. However, during high-frequency transmission, a conductive particle in the conductive adhesive layer has an eddy-current loss, so that the insertion loss of the circuit board is increased to affect the integrity of a signal in transmission.

SUMMARY

An objective of the embodiments of the disclosure is to provide an Electromagnetic Interference (EMI) shielding film, a circuit board, and a preparation method for an EMI shielding film, which can reduce the insertion loss and is effectively applied to ultrahigh frequency transmission.

To achieve the above-mentioned objective, the embodiments of the disclosure provide an EMI shielding film, including a first shielding layer, a second shielding layer, an adhesive film layer and multiple convex particles, wherein the first shielding layer includes a first surface and a second surface opposite to each other, the second surface is a flat surface; the multiple convex particles are adhered on the second surface of the first shielding layer, the second shielding layer is disposed on the second surface of the first shielding layer and covers the multiple convex particles, thereby forming a protrusion portion at a position corresponding to the convex particles on an outer surface of the second shielding layer and forming a gentle portion at other positions; and the adhesive film layer is disposed on the outer surface of the second shielding layer.

As an improvement of the above-mentioned solution, the convex particles include one or more of conductor particles, semiconductor particles, insulator particles and coated compound particles.

As an improvement of the above-mentioned solution, the height of the convex particles is within a range of 0.1 μm to 30 μm.

As an improvement of the above-mentioned solution, multiple conductive protrusions are further formed on the outer surface of the second shielding layer.

As an improvement of the above-mentioned solution, the conductive protrusions are intensively distributed on the protrusion portion.

As an improvement of the above-mentioned solution, the adhesive film layer includes an adhesion layer containing conductive particles.

As an improvement of the above-mentioned solution, the adhesive film layer includes an adhesion layer not containing conductive particles.

As an improvement of the above-mentioned solution, both the first shielding layer and the second shielding layer include one or more of a metal shielding layer, a carbon nano tube shielding layer, a ferrite shielding layer or a graphene shielding layer.

As an improvement of the above-mentioned solution, the metal shielding layer includes a single metal shielding layer and/or an alloy shielding layer, wherein the single metal shielding layer is made of any one of aluminum, titanium, zinc, iron, nickel, chromium, cobalt, copper, silver or gold, and the alloy shielding layer is made of any two or more of aluminum, titanium, zinc, iron, nickel, chromium, cobalt, copper, silver or gold.

As an improvement of the above-mentioned solution, the EMI shielding film further includes a protective film layer, the protective film layer being formed on the first surface of the shielding layer.

Compared with the related art, according to the EMI shielding film disclosed by the embodiments of the disclosure, a protrusion portion is formed at a position corresponding to convex particles on an outer surface of a second shielding layer and a gentle portion is formed at other portions, and an adhesive film layer is disposed on the outer surface of the second shielding layer, so the protrusion portion guarantees that the shielding layers smoothly puncture the adhesive film layer in a lamination process, and an interference charge is guided out normally; meanwhile, the gentle portion also can reduce the insertion loss in use; and therefore, the EMI shielding film is applied to ultrahigh frequency transmission.

The embodiments of the disclosure also provide a circuit board. The circuit board includes a printed circuit board and the EMI shielding film according to any one of the above-mentioned contents, wherein the EMI shielding film is laminated with the printed circuit board through an adhesive film layer; and a protrusion portion punctures the adhesive film layer and extends to a ground layer of the printed circuit board.

Compared with the related art, according to the circuit board provided by the embodiments of the disclosure, the circuit board includes a printed circuit board and the EMI shielding film according to any one of the above-mentioned contents, wherein the EMI shielding film is laminated with the printed circuit board through an adhesive film layer, and a protrusion portion punctures the adhesive film layer and extends to a ground layer of the printed circuit board to guide an interference charge out smoothly; meanwhile, a gentle portion also can reduce the insertion loss in use; and therefore, the circuit board is applied to ultrahigh frequency transmission.

The embodiments of the disclosure also correspondingly provide a preparation method for an EMI shielding film, which is applied to preparing the EMI shielding film according to any one of the above-mentioned contents and includes the following steps:

S1. A first shielding layer is formed, wherein the first shielding layer includes a first surface and a second surface opposite to each other, and the second surface is a flat surface.

S2. Multiple convex particles are formed on the second surface of the first shielding layer.

S3. A second shielding layer is formed on the second surface having the convex particles, wherein a protrusion portion is formed at a position corresponding to the convex particles on an outer surface of the second shielding layer, and a gentle portion is formed at other positions.

S4. An adhesive film layer is formed on the outer surface of the second shielding layer.

As an improvement of the above-mentioned solution, the first shielding layer is formed in S1 by means of the following manners.

A protective film layer is formed on a carrier film, and the first shielding layer is formed on the protective film layer, wherein the first surface is laminated with the protective film layer; or, a peelable layer is formed on a carrier film, the first shielding layer is formed on a surface of the peelable layer, and after the projective film layer is formed on the first surface of the first shielding layer, the carrier film layer is peeled.

As an improvement of the above-mentioned solution, before an adhesive film layer is formed on the outer surface of the second shielding layer, the method further includes the following step:

Multiple conductive protrusions are formed on the outer surface of the second shielding layer via one or more processes of physical roughening, chemical plating, physical vapor deposition, chemical vapor deposition, evaporation plating, splutter plating, electroplating or mixed plating.

As an improvement of the above-mentioned solution, the step that an adhesive film layer is formed on the outer surface of the second shielding layer in S4 specifically includes:

a release film is coated with an adhesive film layer, and then the adhesive film layer is laminated and transferred to the outer surface of the second shielding layer so as to form the adhesive film layer on the outer surface of the second shielding layer, or, the outer surface of the second shielding layer is directly coated with an adhesive film layer so as to form the adhesive film layer on the outer surface of the second shielding layer.

Compared with the related art, according to the preparation method for the EMI shielding film provided by the embodiments of the disclosure, multiple convex particles are formed on a second surface of a first shielding layer, and a second shielding layer is formed on the second surface having the convex particles, so that a protrusion portion is formed at a position corresponding to the convex particles on an outer surface of the second shielding layer, and a gentle portion is formed at other positions. As a result, it may be ensured that the shielding layers smoothly puncture an adhesive film layer in a lamination process, the reliable grounding is achieved, and the practicality is strong; meanwhile, the insertion loss in use is reduced; and therefore, the preparation method is applied to ultrahigh frequency transmission.

DETAILED DESCRIPTION OF THE EMBODIMENTS

The technical solutions in the embodiments of the disclosure will be clearly and completely described herein below with the drawings in the embodiments of the disclosure. Obviously, the described embodiments are only part of the embodiments of the disclosure, not all of the embodiments. On the basis of the embodiments of the disclosure, all other embodiments obtained on the premise of no creative work of a person of ordinary skill in the art fall within the scope of protection of the disclosure.

Figure 1:
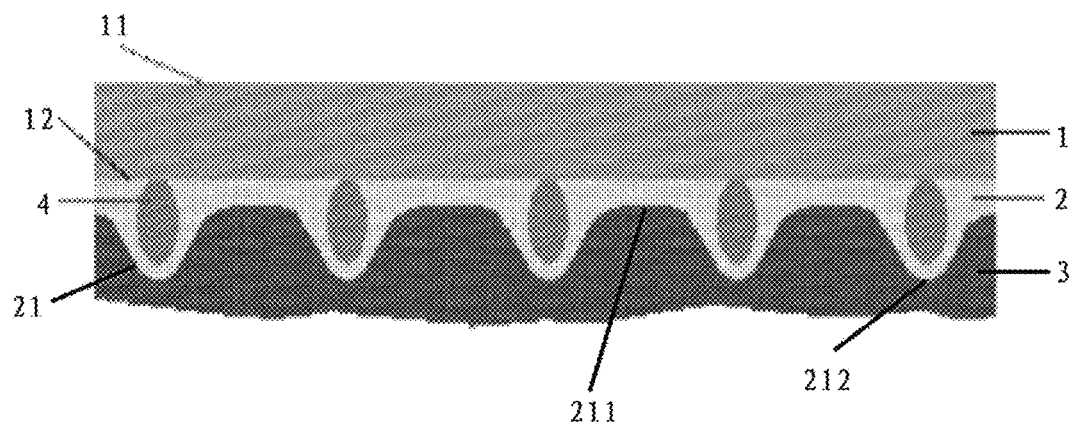
FIG. 1 is a structure diagram of an EMI shielding film in Embodiment 1 of the disclosure.

Referring to FIG. 1, a structure diagram of an EMI shielding film in Embodiment 1 of the disclosure is shown. As shown in FIG. 1, the EMI shielding film includes a first shielding layer 1, a second shielding layer 2, an adhesive film layer 3 and multiple convex particles, wherein the first shielding layer 1 includes a first surface 11 and a second surface 12 opposite to each other, the second surface 12 is a flat surface; the multiple convex particles are adhered on the second surface 12 of the first shielding layer 1; the second shielding layer 2 is disposed on the second surface 12 of the first shielding layer 1 and covers the multiple convex particles, thereby forming a protrusion portion 212 at a position corresponding to the convex particles 4 on an outer surface 21 of the second shielding layer 2 and forming a gentle portion 211 at other positions: and the adhesive film layer 3 is disposed on the outer surface 21 of the second shielding layer 2.

Both the first shielding layer 1 and the second shielding layer 2 have a function of conducting free electrons, and the materials thereof may be the same and may also be different. The first shielding layer 1 and the second shielding layer 2 specifically include one or more of a metal shielding layer, a carbon nano tube shielding layer, a ferrite shielding layer or a graphene shielding layer. The metal shielding layer includes a single metal shielding layer and/or an alloy shielding layer, wherein the single metal shielding layer is made of any one of aluminum, titanium, zinc, iron, nickel, chromium, cobalt, copper, silver or gold, and the alloy shielding layer is made of any two or more of aluminum, titanium, zinc, iron, nickel, chromium, cobalt, copper, silver or gold. In addition, the adhesive film layer 3 is preferably made of the followings: modified epoxy resins, modified acrylates, modified rubbers, modified thermoplastic polyimides and modified polyesters.

In the embodiment, the convex particles 4 are distributed on the second surface 12 of the first shielding film (the second surface 12 is the flat surface), and function as enabling the outer surface 21 of the second shielding film to form a protrusion portion 212, so that when the EMI shielding film is laminated with a printed circuit board, the protrusion portion 212 can puncture the adhesive film layer 3 and a ground layer of the printed circuit board smoothly to implement reliable grounding. The convex particles 4 include one or more of conductor particles, semiconductor particles, insulator particles and coated compound particles (conductor coated insulator particles, or another insulator particles coated by an insulator, etc.), and further include large particles agglomerated by small particles. In actual application, the convex particles 4 are diamond powder, titanium dioxide, silicon powder, silicide powder, silicon dioxide powder, aluminide powder, graphene powder, iron powder, nickel powder, copper powder, nickel-plated diamond powder, metal-plated inorganic powder, etc. It is to be noted that the shape of the convex particles 4 in the disclosure is not limited by graphical representation, the material is also not limited by the above materials, and particles which enable the outer surface 21 of the second shielding layer to form the protrusion portion 212 are all included in a protrusion scope of the disclosure.

In order to form the protrusion portion 212 puncturing the adhesive film layer 3 sufficiently on the outer surface 21 of the second shielding layer, the height of the convex particles 4 is within a range of 0.1 μm to 30 μm. In addition, a proportional relationship between the thickness of the adhesive film layer 3 and the undulation degree of the outer surface 21 of the second shielding layer (equivalent to the height of the protrusion portion 212) is preferably 0.8-2, so as to ensure sufficient puncture strength and adhesive receiving amount. In specific implementation, on the one hand, the phenomenon of delamination caused by insufficient adhesive receiving amount due to too small thickness of the adhesive film layer 3 relative to the undulation degree of the outer surface 21 of the second shielding layer is prevented; and on the other hand, the phenomenon of grounding failure caused by insufficient puncture strength due to too small undulation degree of the outer surface 21 of the second shielding layer relative to the thickness of the adhesive film layer 3. It is to be noted that the undulation degree of the outer surface 21 of the second shielding layer is a distance between a highest point and a lowest point on the outer surface 21 of the second shielding layer.

Based on the above structure, a protrusion portion 212 is formed at a position corresponding to convex particles 4 on an outer surface 21 of a second shielding layer 2 and a gentle portion 211 is formed at other portions, and an adhesive film layer 3 is disposed on the outer surface 21 of the second shielding layer 2, so the protrusion portion 212 on the outer surface 21 of the second shielding layer 2 guarantees that the second shielding layer smoothly punctures the adhesive film layer 3 in a lamination process, and an interference charge is guided out normally; meanwhile, the gentle portion 211 also can reduce the insertion loss in use; and therefore, the EMI shielding film is applied to ultrahigh frequency transmission.

Preferably, the adhesive film layer 3 is an adhesion layer not containing conductive particles, so that the insertion loss of a circuit board in use is reduced, the shielding effect is accelerated, and the bendability of the circuit board is improved.

In another preferred embodiment, the adhesive film layer 3 is an adhesion layer containing conductive particles, so that the adhesive film layer 3 has an adhesive action to tightly adhere the circuit board and the EMI shielding film, and further has a conductive function to quickly guide the interference electron to the ground layer of the circuit board in cooperation with the second shielding layer 2. The conductive particles may be mutually separated conductive particles, and may also be large agglomerated conductive particles. When the conductive particles are the mutually separated conductive particles, the area of electric contact may be further improved to improve the evenness of the electrical contact; and when the conductive particles are large agglomerated conductive particles, the puncture strength may be increased.

Preferably, the EMI shielding film further includes a protective film layer, the protective film layer being formed on the first surface 11 of the shielding layer 1. The protective film layer has an insulated action to guarantee the shielding effect between the first shielding layer 1 and the second shielding layer 2. The protective film layer is one of a Polyphenylene Sulfite (PPS) film layer, a Polythylene Naphtalate (PEN) film layer, a polyester film layer, a polyimide film layer, a film layer formed after curing of epoxy resin ink, a film layer formed after curing of polyurethane ink, a film layer formed after curing of modified acrylic resin, and a film layer formed by curing of polyimide resin.

It is to be noted that the first shielding layer 1 and the second shielding layer 2 in the drawings of the present embodiments may be of a single-layer structure or a multi-layer structure. In addition, the first shielding layer and the second shielding layer in the drawings of the present embodiment may be set to be latticed, foamed or the like according to actual production and application needs.

Figure 2:
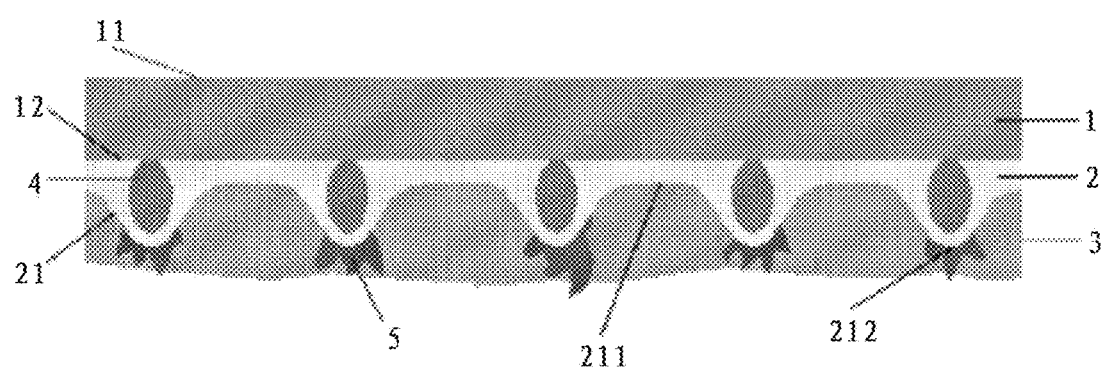
FIG. 2 is a structure diagram of an EMI shielding film in Embodiment 2 of the disclosure.

Referring to FIG. 2, a structure diagram of an EMI shielding film in Embodiment 2 of the disclosure is shown. As shown in FIG. 2, the EMI shielding film includes a first shielding layer 1, a second shielding layer 2, an adhesive film layer 3 and multiple convex particles 4, wherein the multiple convex particles 4 are disposed between the first shielding layer 1 and the second shielding layer 2; the first shielding layer 1 includes a first surface 11 and a second surface 12 opposite to each other; the second surface 12 is a flat surface; the multiple convex particles 4 are adhered on the second surface of the first shielding layer; the second shielding layer 2 is disposed on the second surface 12 of the first shielding layer 1 and covers the multiple convex particles 4, thereby forming a protrusion portion 212 at a position corresponding to the convex particles 4 on an outer surface 21 of the second shielding layer 2 and forming a gentle portion 211 at other positions; the adhesive film layer 3 is disposed on the outer surface 21 of the second shielding layer 2; and multiple conductive protrusions 5 are further formed on the outer surface 21 of the second shielding layer 2.

The conductive protrusions 5 include one or more of metal protrusions, carbon nano tube protrusions and ferrite protrusions. The metal protrusions include single metal protrusions and/or an alloy metal protrusions, wherein the single metal protrusions are made of any one of aluminum, titanium, zinc, iron, nickel, chromium, cobalt, copper, silver or gold, and the alloy metal protrusions are made of any two or more of aluminum, titanium, zinc, iron, nickel, chromium, cobalt, copper, silver or gold. It is to be noted that the materials of the conductive protrusions 5, the first shielding layer 1 and the second shielding layer 2 may be the same, and may also be different.

The conductive protrusions 5 are preferably distributed on the protrusion portion 212 intensively, so that the second shielding layer 2 punctures the adhesive film layer 3 more easily in a lamination process and thus the grounding is implemented and the EMI shielding quality is improved.

Both the first shielding layer 1 and the second shielding layer 2 have a function of conducting a free electron, and the materials thereof may be the same and may also be different. The first shielding layer 1 and the second shielding layer 2 specifically include one or more of a metal shielding layer, a carbon nano tube shielding layer, a ferrite shielding layer or a graphene shielding layer. The metal shielding layer includes a single metal shielding layer and/or an alloy shielding layer, wherein the single metal shielding layer is made of any one of aluminum, titanium, zinc, iron, nickel, chromium, cobalt, copper, silver or gold, and the alloy shielding layer is made of any two or more of aluminum, titanium, zinc, iron, nickel, chromium, cobalt, copper, silver or gold. In addition, the adhesive film layer 3 is preferably made of the followings: modified epoxy resins, modified acrylates, modified rubbers, modified thermoplastic polyimides and modified polyesters.

In the embodiment, the convex particles 4 are distributed on the second surface 12 of the first shielding film (the second surface 12 is the flat surface), and function as enabling the outer surface 21 of the second shielding film to form a protrusion portion 212, so that when the EMI shielding film is laminated with a printed circuit board, the protrusion portion 212 can puncture the adhesive film layer 3 and a ground layer of the printed circuit board smoothly to implement reliable grounding. The convex particles 4 include one or more of conductor particles, semiconductor particles, insulator particles and coated compound particles (conductor coated insulator particles, or another insulator particles coated by an insulator, etc.), and further include large particles agglomerated by small particles. In actual application, the convex particles 4 are diamond powder, titanium dioxide, silicon powder, silicide powder, silicon dioxide powder, aluminide powder, graphene powder, iron powder, nickel powder, copper powder, nickel-plated diamond powder, metal-plated inorganic powder, etc. It is to be noted that the shape of the convex particles 4 in the disclosure is not limited by graphical representation, the material is also not limited by the above materials, and particles which enable the outer surface 21 of the second shielding layer to form the protrusion portion 212 are all included in a protrusion scope of the disclosure.

In order to form the protrusion portion 212 puncturing the adhesive film layer 3 sufficiently on the outer surface 21 of the second shielding layer, the height of the convex particles 4 is within a range of 0.1 μm to 30 μm. In addition, a proportional relationship between the thickness of the adhesive film layer 3 and the sum of the undulation degree of the outer surface 21 of the second shielding layer (equivalent to the height of the protrusion portion 212) and the height of the conductive protrusions 5 is preferably 0.8-2, so as to ensure sufficient puncture strength and adhesive receiving amount. In specific implementation, on the one hand, the phenomenon of delamination caused by insufficient adhesive receiving amount due to too small thickness of the adhesive film layer 3 relative to the sum of the undulation degree of the outer surface 21 of the second shielding layer and the height of the conductive protrusions 5 is prevented: and on the other hand, the phenomenon of grounding failure caused by insufficient puncture strength due to too small sum of the undulation degree of the outer surface 21 of the second shielding layer and the height of the conductive protrusions 5 relative to the thickness of the adhesive film layer 3. It is to be noted that the undulation degree of the outer surface 21 of the second shielding layer is a distance between a highest point and a lowest point on the outer surface 21 of the second shielding layer.

Based on the above structure, a protrusion portion 212 is formed at a position corresponding to convex particles 4 on an outer surface 21 of a second shielding layer 2 and a gentle portion 211 is formed at other portions, an adhesive film layer 3 is disposed on the outer surface 21 of the second shielding layer 2 and multiple conductive protrusions 5 are further formed on the outer surface 21 of the second shielding layer 2, so the protrusion portion 212 on the outer surface 21 of the second shielding layer is cooperated with the conductive protrusions 5 thereon to enhance the puncture function and guarantee that the second shielding layer 2 smoothly punctures the adhesive film layer 3 in a lamination process, and an interference charge is guided out normally, thus implementing the reliable grounding; meanwhile, the gentle portion 211 also can reduce the insertion loss in use; and therefore, the EMI shielding film is applied to ultrahigh frequency transmission.

Preferably, the adhesive film layer 3 is an adhesion layer not containing conductive particles, so that the insertion loss of a circuit board in use is reduced, the shielding effect is accelerated, and the bendability of the circuit board is improved.

In addition, the conductive protrusions 5 are preferably distributed on the protrusion portion 212 intensively, so that the second shielding layer 2 punctures the adhesive film layer 3 more easily in a lamination process and thus the grounding is implemented and the EMI shielding quality is improved.

In another preferred embodiment, the adhesive film layer 3 is an adhesion layer containing conductive particles, so that the adhesive film layer 3 has an adhesive action to tightly adhere the circuit board and the EMI shielding film, and further has a conductive function to quickly guide the interference electron to the ground layer of the circuit board in cooperation with the second shielding layer 2. The conductive particles may be mutually separated conductive particles, and may also be large agglomerated conductive particles. When the conductive particles are the mutually separated conductive particles, the area of electric contact may be further improved to improve the evenness of the electrical contact; and when the conductive particles are large agglomerated conductive particles, the puncture strength may be increased.

Preferably, the EMI shielding film further includes a protective film layer, the protective film layer being formed on the first surface 11 of the shielding layer 1. The protective film layer has an insulated action to guarantee the shielding effect between the first shielding layer 1 and the second shielding layer 2. The protective film layer is one of a Polyphenylene Sulfite (PPS) film layer, a Polythylene Naphtalate (PEN) film layer, a polyester film layer, a polyimide film layer, a film layer formed after curing of epoxy resin ink, a film layer formed after curing of polyurethane ink, a film layer formed after curing of modified acrylic resin, and a film layer formed by curing of polyimide resin.

It is to be noted that the first shielding layer 1 and the second shielding layer 2 in the drawings of the present embodiments may be of a single-layer structure or a multi-layer structure. In addition, the first shielding layer and the second shielding layer in the drawings of the present embodiment may be set to be latticed, foamed or the like according to actual production and application needs.

Figure 3:
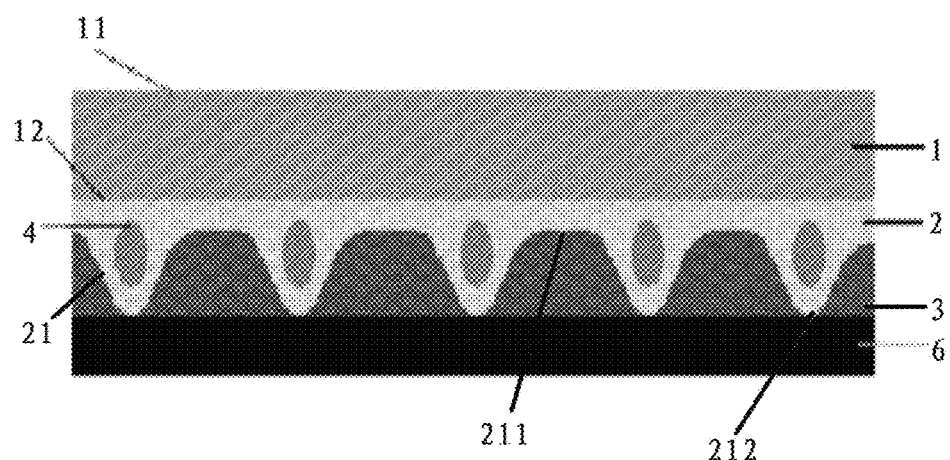
FIG. 3 is a structure diagram of a circuit board in Embodiment 3 of the disclosure.

Referring to FIG. 3, a structure diagram of a circuit board in Embodiment 3 of the disclosure is shown. The circuit board includes a printed circuit board 6 and the EMI shielding film in Embodiment 1, wherein the EMI shielding film is laminated with the printed circuit board 6 through an adhesive film layer 3; and a protrusion portion 212 punctures the adhesive film layer 3 and extends to a ground layer of the printed circuit board 6.

In the embodiment, the implementation manner of the EMI shielding film may be referred to the description in Embodiment 1 and will not be repeated herein.

Preferably, the printed circuit board 6 is one of a flexible single-side board, a flexible double-side board, a flexible multi-layer board or a rigid combined board.

By means of the above-mentioned structure, in a lamination process, the adhesive film layer 3 is punctured by using the protrusion portion 212 of the second shielding layer 2, so at least part of the outer surface 21 of the second shielding layer 2 is connected to the ground layer of the printed circuit board. Thus, the interference charge in the first shielding layer 1 and the second shielding layer 2 is guided into the ground, thereby avoiding influence on normal operation of the circuit board caused by forming of an interference source due to gathering of the interference charge.

Meanwhile, the gentle portion 211 also can reduce the insertion loss in use. Therefore, the circuit board is applied to ultrahigh frequency transmission.

Figure 4:
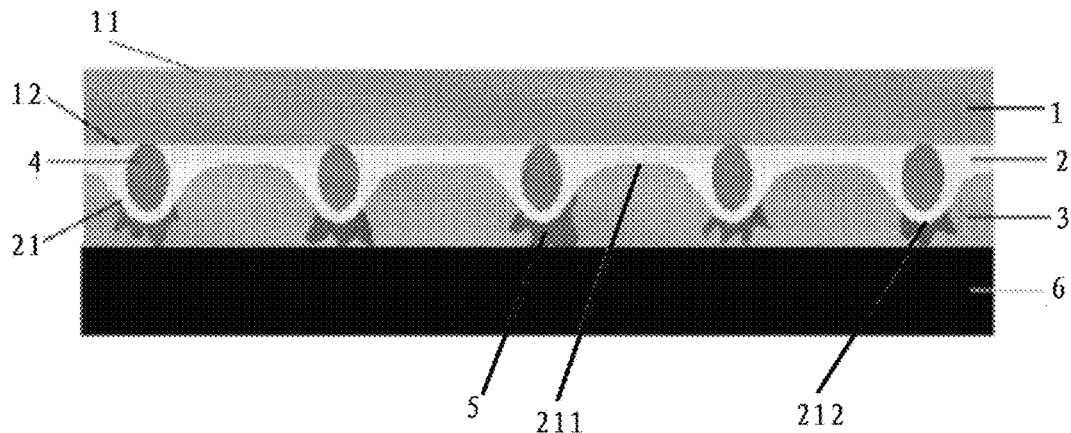
FIG. 4 is a structure diagram of a circuit board in Embodiment 4 of the disclosure.

Referring to FIG. 4, a structure diagram of a circuit board in Embodiment 4 of the disclosure is shown. The circuit board includes a printed circuit board 6 and the EMI shielding film in Embodiment 2, wherein the EMI shielding film is laminated with the printed circuit board 6 through an adhesive film layer 3; and a protrusion portion 212 punctures the adhesive film layer 3 and extends to a ground layer of the printed circuit board 6.

In the embodiment, the implementation manner of the EMI shielding film may be referred to the description in Embodiment 2 and will not be repeated herein.

By means of the above-mentioned structure, in a lamination process, the protrusion portion 212 are cooperated with the conductive protrusions 5 thereon to puncture the adhesive film layer 3, so at least part of the outer surface 21 of the second shielding layer 2 is connected to the ground layer of the printed circuit board. Thus, the interference charge in the first shielding layer 1 and the second shielding layer 2 is guided into the ground, thereby avoiding influence on normal operation of the circuit board caused by forming of an interference source due to gathering of the interference charge. Meanwhile, the gentle portion 211 also can reduce the insertion loss in use. Therefore, the circuit board is applied to ultrahigh frequency transmission.

Figure 5:
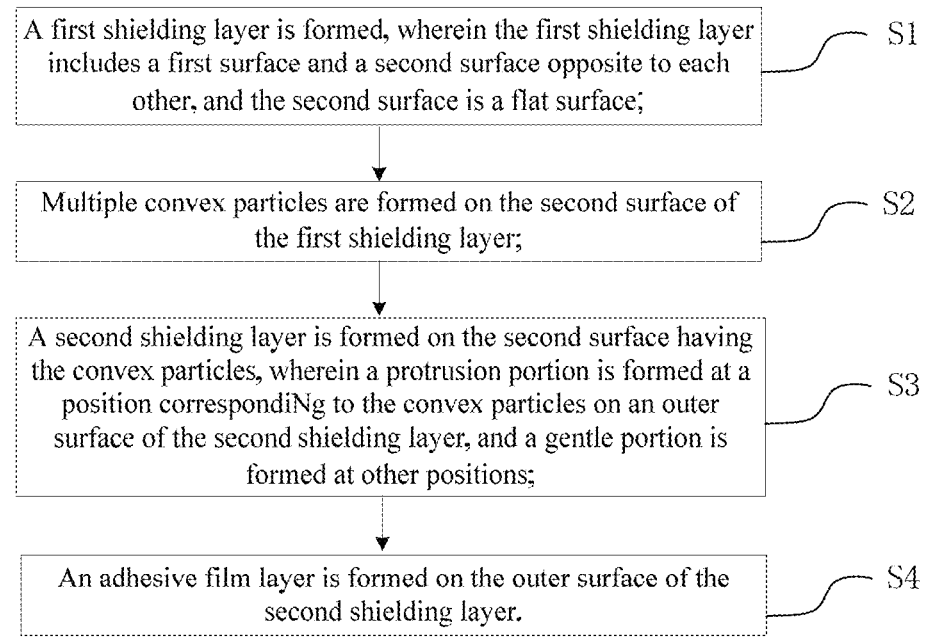
FIG. 5 is a flowchart of a preparation method for an EMI shielding film in Embodiment 5 of the disclosure.

Referring to FIG. 5, a flowchart of a preparation method for an EMI shielding film in Embodiment 5 of the disclosure is shown. The method is applied to preparation of the EMI shielding film in Embodiment 1, and includes the following steps:

S1. A first shielding layer is formed, wherein the first shielding layer includes a first surface and a second surface opposite to each other, and the second surface is a flat surface.

The first shielding layer is formed in step S1 by means of the following manners.

A protective film layer is formed on a carrier film, and the first shielding layer is formed on the protective film layer, wherein the first surface is laminated with the protective film layer; or, a peelable layer is formed on a carrier film, the first shielding layer is formed on a surface of the peelable layer, and after the projective film layer is formed on the first surface of the first shielding layer, the carrier film layer is peeled.

S2. Multiple convex particles are formed on the second surface of the first shielding layer.

S3. A second shielding layer is formed on the second surface having the convex particles, wherein the second shielding layer is formed on the second surface having the convex particles, a protrusion portion is formed at a position corresponding to the convex particles on an outer surface of the second shielding layer, and a gentle portion is formed at other positions.

S4. An adhesive film layer is formed on the outer surface of the second shielding layer.

The step that an adhesive film layer is formed on the outer surface of the second shielding layer in S4 specifically includes the following step:

a release film is coated with an adhesive film layer, and then the adhesive film layer is laminated and transferred to the outer surface of the second shielding layer so as to form the adhesive film layer on the second surface of the shielding layer; or, the outer surface of the second shielding layer is directly coated with an adhesive film layer so as to form the adhesive film layer on the outer surface of the second shielding layer.

It is to be noted that the formation of the first shielding layer, the convex particles, the second shielding layer or the glass layer may preferably use a chemical playing manner, PVD, CVD, evaporation plating, splutter plating, electroplating or mixed plating.

In another preferred embodiment applied to the preparation of the EMI shielding film in Embodiment 2, prior to the step 4, the method further includes the following step:

multiple conductive protrusions are formed on the outer surface of the second shielding layer via one or more processes of physical roughening, chemical plating, physical vapor deposition, chemical vapor deposition, evaporation plating, splutter plating, electroplating or mixed plating.

The above description is a preferred implementation manner of the disclosure. It should be noted that those of ordinary skill in the art may also make some improvements and modifications without departing from the principle of the disclosure. These improvements and modifications fall within the scope of protection of the disclosure.

What is claimed is:

1. An Electromagnetic Interference shielding film, comprising a first shielding layer, a second shielding layer, an adhesive film layer and multiple convex particles, wherein the first shielding layer comprises a first surface and a second surface opposite to each other; the second surface is a flat surface; the multiple convex particles are adhered on the second surface of the first shielding layer, the second shielding layer is disposed on the second surface of the first shielding layer and covers the multiple convex particles, thereby forming a protrusion portion at a position corresponding to the convex particles on an outer surface of the second shielding layer and forming a gentle portion at other positions; and the adhesive film layer is disposed on the outer surface of the second shielding layer.

2. The electromagnetic Interference shielding film as claimed in claim 1, wherein the convex particles comprise one or more of conductor particles, semiconductor particles, insulator particles and coated compound particles.

3. The electromagnetic Interference shielding film as claimed in claim 1, wherein the height of the convex particles is within a range of 0.1 μm to 30 μm.

4. The electromagnetic Interference shielding film as claimed in claim 1, wherein multiple conductive protrusions are further formed on the outer surface of the second shielding layer.

5. The electromagnetic Interference shielding film as claimed in claim 4, wherein the conductive protrusions are intensively distributed on the protrusion portion.

6. The electromagnetic Interference shielding film as claimed in claim 1, wherein the adhesive film layer comprises an adhesion layer containing conductive particles.

7. The electromagnetic Interference shielding film as claimed in claim 1, wherein the adhesive film layer comprises an adhesion layer not containing conductive particles.

8. The electromagnetic Interference shielding film as claimed in claim 1, wherein both the first shielding layer and the second shielding layer comprise one or more of a metal shielding layer, a carbon nano tube shielding layer, a ferrite shielding layer or a graphene shielding layer.

9. The electromagnetic Interference shielding film as claimed in claim 8, wherein the metal shielding layer comprises a single metal shielding layer and/or an alloy shielding layer; the single metal shielding layer is made of any one of aluminum, titanium, zinc, iron, nickel, chromium, cobalt, copper, silver or gold, and the alloy shielding layer is made of any two or more of aluminum, titanium, zinc, iron, nickel, chromium, cobalt, copper, silver or gold.

10. The electromagnetic Interference shielding film as claimed in claim 1, wherein the electromagnetic Interference shielding film further comprises a protective film layer, the protective film layer being formed on the first surface of the shielding layer.

11. A circuit board, comprising a printed circuit board and the Electromagnetic Interference shielding film according to claim 1, wherein the electromagnetic Interference shielding film is laminated with the printed circuit board through an adhesive film layer; and a protrusion portion punctures the adhesive film layer and extends to a ground layer of the printed circuit board.

12. A preparation method for an Electromagnetic Interference shielding film, applied to preparing the electromagnetic Interference shielding film according to claim 1 and comprising the following steps:
   S1. forming first shielding layer, wherein the first shielding layer includes a first surface and a second surface opposite to each other, and the second surface is a flat surface;
   S2. forming multiple convex particles on the second surface of the first shielding layer;
   S3. forming a second shielding layer on the second surface having the convex particles, wherein a protrusion portion is formed at a position corresponding to the convex particles on an outer surface of the second shielding layer, and a gentle portion is formed at other positions; and
   S4. forming an adhesive film layer on the outer surface of the second shielding layer.

13. The preparation method for the electromagnetic Interference shielding film as claimed in claim 12, wherein the first shielding layer is formed in the step S1 by means of the following manners:
   forming a protective film layer on a carrier film, and forming the first shielding layer on the protective film layer, wherein the first surface is laminated with the protective film layer, or
   forming a peelable layer on a carrier film, forming the first shielding layer on a surface of the peelable layer, and after the projective film layer is formed on the first surface of the first shielding layer, peeling the carrier film layer.

14. The preparation method for the electromagnetic Interference shielding film as claimed in claim 13, before forming an adhesive film on the outer surface of the second shielding layer, the preparation method further comprising:
   forming multiple conductive protrusions on the outer surface of the second shielding layer via one or more processes of physical roughening, chemical plating, physical vapor deposition, chemical vapor deposition, evaporation plating, splutter plating, electroplating or mixed plating.

15. The preparation method for the electromagnetic Interference shielding film as claimed in claim 12, before forming an adhesive film layer on the outer surface of the second shielding layer, further comprising:
   forming multiple conductive protrusions on the outer surface of the second shielding layer via one or more processes of physical roughening, chemical plating, physical vapor deposition, chemical vapor deposition, evaporation plating, splutter plating, electroplating or mixed plating.

16. The preparation method for the electromagnetic Interference shielding film as claimed in claim 12, wherein the forming an adhesive film layer on the outer surface of the second shielding layer in step S4 specifically comprises:
   coating the adhesive film layer on a release film, and then laminating and transferring the adhesive film layer to the outer surface of the second shielding layer so as to form the adhesive film layer on the outer surface of the second shielding layer; or,
   directly coating the adhesive film layer on the outer surface of the second shielding layer so as to form the adhesive film layer on the outer surface of the second shielding layer.

17. The preparation method for the electromagnetic Interference shielding film as claimed in claim 12, wherein the convex particles comprise one or more of conductor particles, semiconductor particles, insulator particles and coated compound particles.

18. The preparation method for the electromagnetic Interference shielding film as claimed in claim 12, wherein the height of the convex particles is within a range of 0.1 μm to 30 μm.

19. The preparation method for the electromagnetic Interference shielding film as claimed in claim 12, wherein multiple conductive protrusions are further formed on the outer surface of the second shielding layer.

20. The preparation method for the electromagnetic Interference shielding film as claimed in claim 19, wherein the conductive protrusions are intensively distributed on the protrusion portion.

* * * * *